US012564902B2

(12) United States Patent
Yehle et al.

(10) Patent No.: US 12,564,902 B2
(45) Date of Patent: Mar. 3, 2026

(54) TRIM CUT WITH QRATE ADJUSTMENT

(71) Applicant: Texas Instruments Incorporated,
Dallas, TX (US)

(72) Inventors: Joseph Yehle, Dallas, TX (US); **Roy
Deidrick Solomon**, Melissa, TX (US)

(73) Assignee: **TEXAS INSTRUMENTS
INCORPORATED**, Dallas, TX (US)

( * ) Notice: Subject to any disclaimer, the term of this
patent is extended or adjusted under 35
U.S.C. 154(b) by 421 days.

(21) Appl. No.: 18/175,338

(22) Filed: Feb. 27, 2023

(65) Prior Publication Data

US 2024/0286224 A1    Aug. 29, 2024

(51) Int. Cl.
| | |
|---|---|
| *B23K 26/08* | (2014.01) |
| *B23K 26/0622* | (2014.01) |
| *B23K 26/38* | (2014.01) |
| *B23K 101/40* | (2006.01) |
| *B23K 101/42* | (2006.01) |
| *H01L 21/67* | (2006.01) |
| *H01L 21/768* | (2006.01) |

(52) U.S. Cl.
CPC .......... *B23K 26/38* (2013.01); *B23K 26/0622*
(2015.10); *B23K 26/0869* (2013.01); *H01L
21/67092* (2013.01); *H01L 21/76894*
(2013.01); *B23K 2101/40* (2018.08); *B23K
2101/42* (2018.08)

(58) Field of Classification Search
CPC ................ B23K 26/38; B23K 26/0622; B23K
26/0869; B23K 2101/40; B23K 2101/42;
H01L 21/67092; H01L 21/76894
See application file for complete search history.

(56) References Cited

U.S. PATENT DOCUMENTS 6,818,966 B2    11/2004  Beach et al.

FOREIGN PATENT DOCUMENTS

JP          2016134506 A  *  7/2016

* cited by examiner

*Primary Examiner* — William B Partridge
*Assistant Examiner* — Chevy J Boegel
(74) *Attorney, Agent, or Firm* — Ronald O. Neerings;
Frank D. Cimino

(57) ABSTRACT

A method of fabricating an electronic component includes:
controlling a laser cutting tool at a first pulse rate to form a
first cut portion in a feature of the electronic component, the
feature having opposite first and second sides spaced apart
from one another along a first direction, and third and fourth
sides spaced apart from one another along a second direc-
tion, the first cut portion extending from the third side
toward the fourth side; controlling the laser cutting tool at a
higher second pulse rate and to form a second cut portion
extending from the first cut portion toward the fourth side;
and controlling the laser cutting tool at a third pulse rate to
form a final cut portion extending from the second cut
portion toward the fourth side, the third pulse rate less than
the second pulse rate.

17 Claims, 13 Drawing Sheets

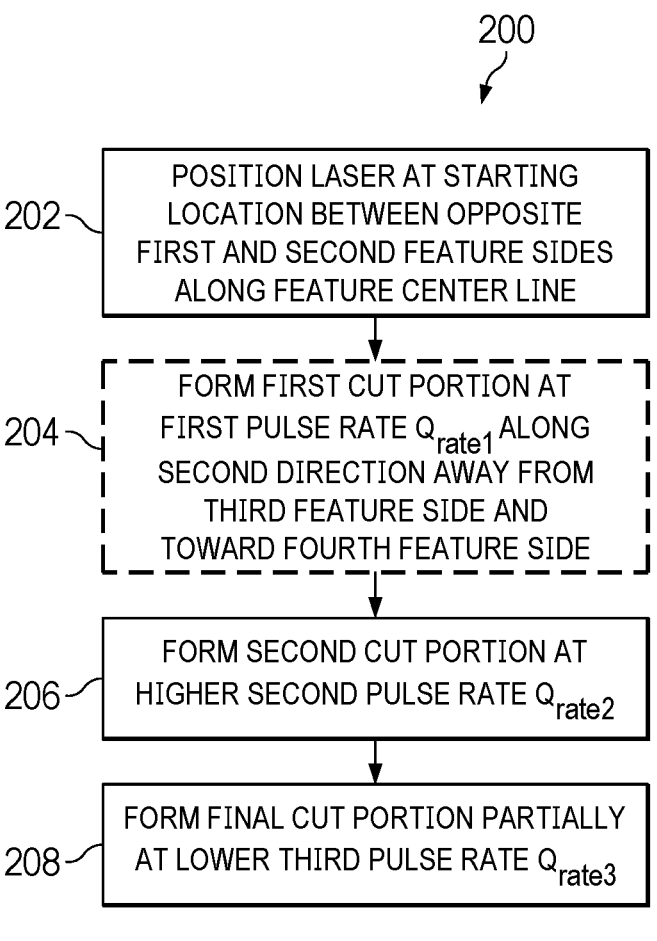

200

| | POSITION LASER AT STARTING LOCATION BETWEEN OPPOSITE FIRST AND SECOND FEATURE SIDES ALONG FEATURE CENTER LINE |
|---|---|
| 202 | |

FORM FIRST CUT PORTION AT FIRST PULSE RATE $Q_{rate1}$ ALONG SECOND DIRECTION AWAY FROM THIRD FEATURE SIDE AND TOWARD FOURTH FEATURE SIDE

204

FORM SECOND CUT PORTION AT HIGHER SECOND PULSE RATE $Q_{rate2}$

206

FORM FINAL CUT PORTION PARTIALLY AT LOWER THIRD PULSE RATE $Q_{rate3}$

TRIM CUT WITH QRATE ADJUSTMENT

BACKGROUND

Electronic components of an integrated circuit (IC) or other packaged electronic device can be trimmed during manufacturing to set a component value, mode or other performance metric of the component. Laser trimming creates a cut in a component feature, for example, to inhibit current flow and increase a component resistance from a starting value to a final value within a tolerance range of a desired final value. Straight single cut formation tends to saturate or lose control as the cut gets longer, and the final trimmed value accuracy depends on the ability to terminate trimming without overshooting. Adding additional trim cuts can enhance accuracy by allowing fine tuning, but this adds significate manufacturing cost due to extended trim time.

SUMMARY

In one aspect, an electronic component includes first and second terminals and a feature that has opposite first and second sides spaced apart from one another along a first direction, third and fourth sides spaced apart from one another along an orthogonal second direction, and a cut extending in the feature and having a first cut portion, a second cut portion, and a final cut portion. The first terminal is connected to a portion of the first side and the second terminal is connected to a portion of the second side. The first cut portion extends from the third side toward the fourth side along the second direction. The second cut portion extends from the first cut portion toward the fourth side and has deviations in at least one of one of a cut spot size and a cut spot spacing distance.

In another aspect, a method of fabricating an electronic component includes controlling a laser cutting tool at a first pulse rate and translating the laser cutting tool to form a first cut portion in a feature of the electronic component, where the feature has opposite first and second sides spaced apart from one another along a first direction, and third and fourth sides spaced apart from one another along an orthogonal second direction, a first terminal connected to a portion of the first side, a second terminal connected to a portion of the second side, and the first cut portion extends from the third side toward the fourth side along the second direction. The method further includes controlling the laser cutting tool at a higher second pulse rate and translating the laser cutting tool to form a second cut portion extending from the first cut portion toward the second side, and controlling the laser cutting tool at a third pulse rate and translating the laser cutting tool to form a final cut portion extending from the second cut portion toward the fourth side, where the third pulse rate is less than the second pulse rate.

In a further aspect, a system for fabricating an electronic component includes a laser cutting tool and a controller. The laser cutting tool is configured to remove material from a feature of an electronic component, the feature having opposite first and second sides spaced apart from one another along a first direction, third and fourth sides spaced apart from one another along an orthogonal second direction. The controller is configured to control the laser cutting tool at a first pulse rate and translate the laser cutting tool to form a first cut portion in the feature of the electronic component, the first cut portion extending from the third side toward the fourth side along the second direction. The controller is configured to control the laser cutting tool at a higher second pulse rate and translate the laser cutting tool to form a second cut portion extending from the first cut portion toward the second side and to control the laser cutting tool at a third pulse rate and translate the laser cutting tool to form a final cut portion extending from the second cut portion toward the fourth side, where the third pulse rate is less than the second pulse rate.

BRIEF DESCRIPTION OF THE DRAWINGS

FIG. 2 is a flow diagram of a method.

DETAILED DESCRIPTION

Figure 1:
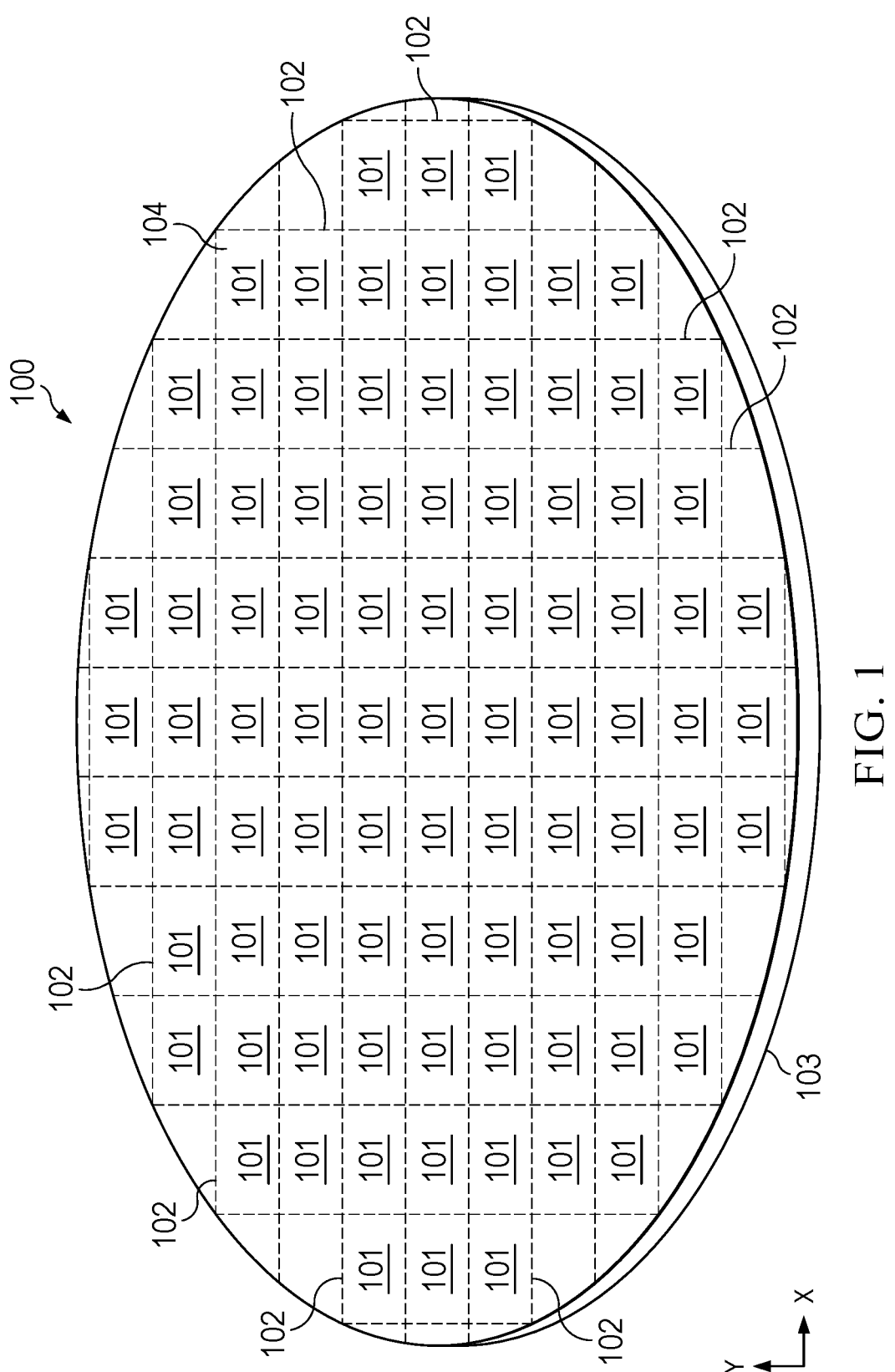
FIG. 1 is a top perspective view of a semiconductor wafer with top side trimmable components in rows and columns of prospective semiconductor dies of unit areas and scribe streets.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value and "substantially no" means zero or no measurable amount that reasonably affects quality or operation of a finished product or effectivity of a process. The example structures include layers or materials described as over or on another layer or material or surface, which can be a layer or material directly on and contacting the other layer or material or surface where other materials, such as impurities or artifacts or remnant materials from fabrication processing may be present between the layer or material and the other layer or material or surface.

Figure 1A:
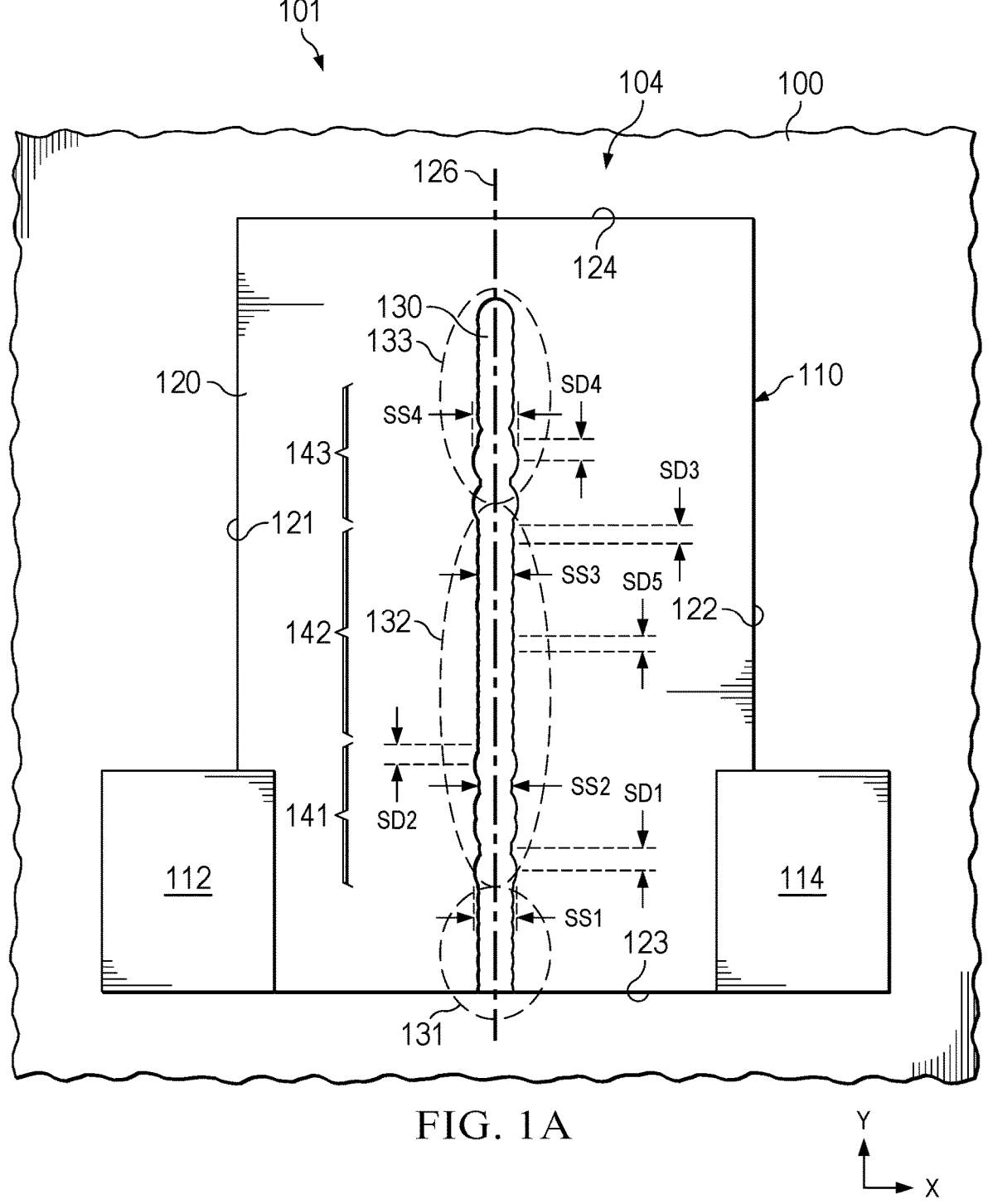
FIG. 1A is a partial side view of a trimmable electronic component with a trim cut in a unit of the semiconductor wafer.
Figure 1B:
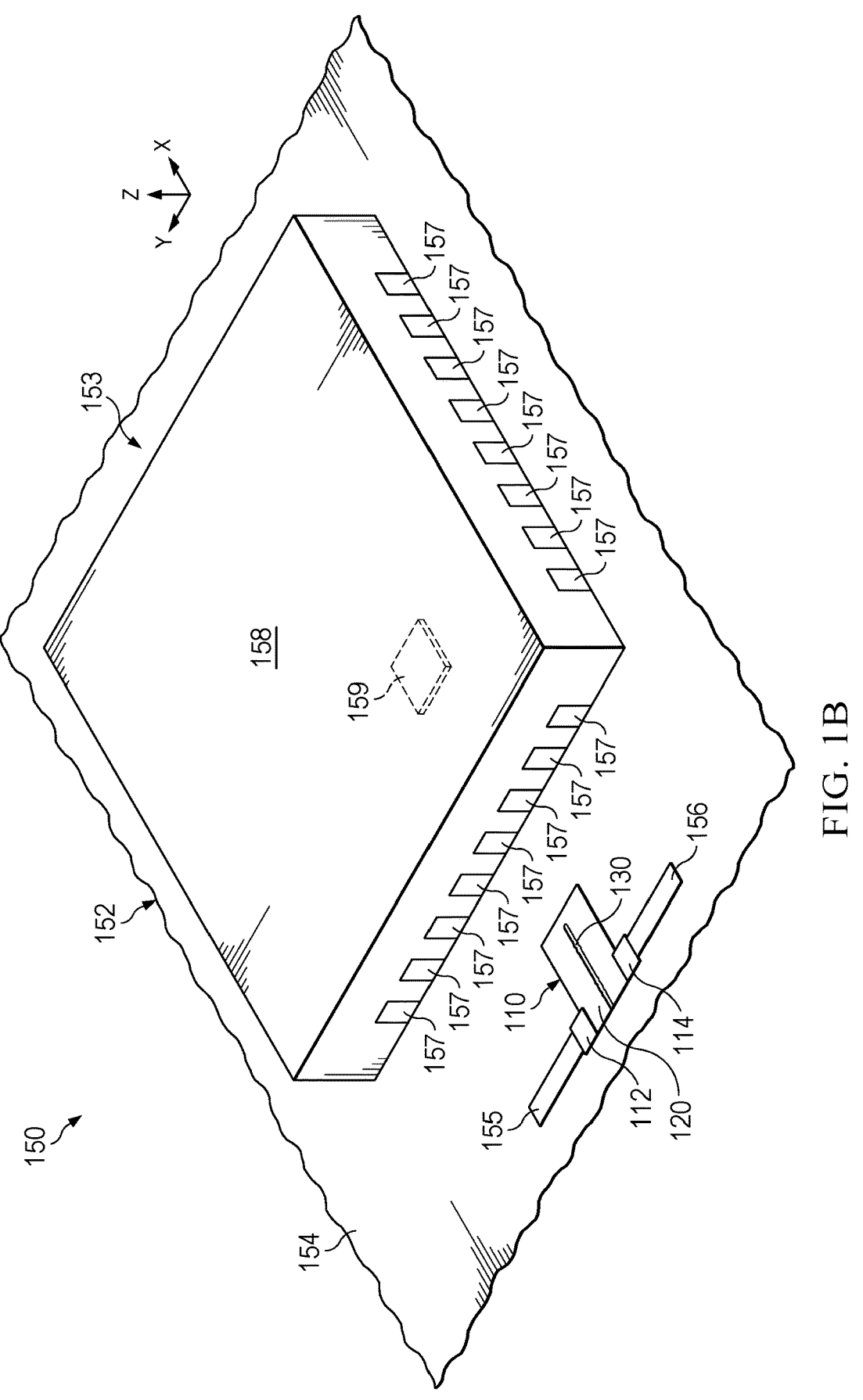
FIG. 1B is a perspective view of a system with a packaged electronic device mounted to a circuit board and a trimmed electronic component of the circuit board.

Referring initially to FIGS. 1-1B, FIGS. 1 and 1A show an example semiconductor wafer 100 and FIG. 1B shows a packaged electronic device 153 that includes a die 159 separated from the wafer 100. The semiconductor wafer 100 is shown in FIG. 1 in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. The semiconductor wafer 100 in FIG. 1 includes an array of unit areas 101 arranged in rows along the first direction X and columns along the second direction Y. The unit areas 101 are subsequently separated from the wafer 100 to form semiconductor dies, such as the semiconductor die 159 in FIG. 1B. The semiconductor wafer 100 has respective scribe streets 102 between adjacent unit areas 101. As best shown in FIG. 1, the semiconductor wafer 100 has opposite first and second (e.g., bottom and top) sides 103 and 104, respectively, which are spaced apart from one another along the third direction Z. The top side 104 extends in a plane of the first and second directions X and Y. The semiconductor wafer 100 includes trimmable electronic components in the unit areas 101 and can include trimmable electronic components in one or more of the scribe streets 102.

FIG. 1A shows a trimmable electronic component 110 in one unit area 101 along the top or second side 104 of the semiconductor wafer 100. Any type of trimmable electronic component can be trimmed. The illustrated example is a resistor component 110 with a conductive first terminal 112, a conductive second terminal 114 and a rectangular feature 120 that extends between conductive terminals 112 and 114. The feature 120 in one example is or includes a deposited film of silicon chromium (e.g., SiCr) of any suitable stoichiometry, thickness and dimensions. The feature 120 has a substantially rectangular shape with opposite respective first and second sides 121 and 122 that are spaced apart from one another along the first direction X, and opposite respective third and fourth sides 123 and 124 that are spaced apart from one another along the orthogonal second direction Y. A center line 126 of the rectangular feature 120 extends along the second direction Y approximately midway between the respective first and second sides 121 and 122 of the feature 120.

The feature 120 has a cut 130 that extends partially in the feature 120. The feature 120 in one example is exposed along the top side 104 of the wafer 100 to allow a laser cutting tool to form the cut 130 therein to trim or otherwise adjust or set to the resistance of the resistor component 110 between the terminals 112 and 114. In another example, the feature 120 can be in the wafer, such as underneath one or more layers (not shown) through which a laser cutting tool can form the cut 130 to trim an electrical component. In the illustrated example, the cut 130 has a first cut portion 131, a second cut portion 132, and a final cut portion 133. The cut 130 in this example has a beginning or first end along the third side 123 and extends toward the fourth side 124. In this example, the cut 130 extends approximately perpendicular to the direction of current flow between the terminals 112 and 114. In other example (e.g., FIG. 5 below), a cut can extend approximately parallel to the direction of current flow. The conductive terminals 112 and 114 are connected to respective opposite ones of the first, second, third, and fourth sides 121-124. In the example of FIG. 1A, the first terminal 112 is connected to a portion of the first side 121 and the second terminal 114 is connected to a portion of the second side 122 of the feature 120. In one implementation, the resistor component 110 is part of a circuit of the unit area 101 and the value of the resistance between the terminals 112 and 114 is trimmed during manufacturing to set or adjust one or more operational parameters of the circuit. In one implementation, the resistor component 110 is trimmed during wafer fabrication processing, for example, as part of wafer probe testing with a probe circuit actively monitoring (e.g., measuring) the component resistance during cutting operations to achieve a final component resistance value within a desired tolerance range. As shown in FIG. 1A, the first cut portion 131 extends from a first end along the third side 123 at least partially toward the fourth side 124. In various implementations, the first cut portion 131 extends substantially along the second direction Y (e.g., within +/−10 degrees, such as within +/−2 degrees, preferably within +/−1 degree). In the illustrated example, the first cut portion 131 extends along the second direction Y.

The second cut portion 132 extends from the first cut portion 131 at least partially toward the fourth side 124. The second cut portion 132 includes first and second segments 141 and 142. The first segment 141 extends from the first cut portion 131 at least partially toward the fourth side 124. The second segment 142 extends from the first segment 141 at least partially toward the fourth side 124. The final cut portion 133 includes a third segment 143 and extends from the second segment 142 toward the fourth side 124. The cut 130 and the individual portions and segments thereof extend substantially along the second direction Y in the illustrated example. In other implementations one or more portions and/or segments of the cut 130 can extend at a non-zero angle to the second direction Y.

As further shown in FIG. 1A, the first and third segments 141 and 143 have deviations in at least one of one of a cut spot size SS and a cut spot spacing distance SD. Cut spot size deviations, as used herein, include differences in dimensions of two cut spots of the cut 130 that differ by 10% or more from one another, such as diameter differences for substantially circular cut spots, or other dimensional variations in the first and/or second directions X, Y or in a plane of the first and/or second directions X, Y, for example, for oval or other non-circular cut spots created by a laser cutting tool during trimming of the component 110 by formation of the cut 130. In certain examples, all or one or more segments of the second cut portion 132 include cut spot size and/or cut spot spacing distance deviations. In some examples, the second cut portion 132 has deviations in two or more cut spot sizes SS, alone or in combination with deviations in two or more cut spot spacing distances SD. In other examples, the second cut portion 132 has deviations in two or more cut spot spacing distances SD, alone or in combination with deviations in two or more cut spot sizes SS. The example of FIG. 1A includes different cut spot size SS1 and SS2 in the first segment 141 of the second cut portion 132 and the first segment 141 has other cut spot size deviations that are not numerically designated in the figures. In this example, moreover, the third segment 143 of the third cut portion 133 has different cut spot size SS3 and SS4 as well as other cut spot size deviations that are not designated.

The cut 130 in FIG. 1A also includes cut spot spacing distance deviations, as used herein, include differences in spacing dimensions, such as a center-to-center spacing distance SD of two adjacent or overlapping cut spots of the cut 130 that differ by 10% or more from a center-to-center spacing distance SD of another pair of adjacent or overlapping cut spots of the cut 130 in a direction approximately parallel to the direction of the cut 130 (e.g., approximately along the second direction Y in FIG. 1A). The example of FIG. 1A includes different center-to-center cut spot spacing distances SD1 and SD2 in the first segment 141 of the second cut portion 132 and the first segment 141 has other cut spot size deviations that are not numerically designated in the figures. In this example, moreover, the third segment 143 of the third cut portion 133 has different center-to-center cut spot spacing distances SD3 and SD4 as well as other cut spot size deviations that are not designated. In the illustrated example, the second segment 142 of the second cut portion 132 has approximately uniform cut spot sizes (e.g., less than 10% deviation) and approximately uniform cut spot spacing distances SD5 (e.g., less than 10% deviation with center to center spacing distance of approximately 0.1 μm to 2.6 μm, such as approximately 0.2 μm to approximately 2.0 μm in one example.

In one example, the second cut portion 132 has deviations of approximately 10% to 50% in at least one of one of the cut spot size SS and the cut spot spacing distance SD. In these or other examples, the second cut portion 132 has deviations of approximately 20% to 40% in at least one of one of the cut spot size SS and the cut spot spacing distance SD. In the illustrated example, the cut 130 extends at least partially along the center line 126 of the feature 120. In other examples, all or part of the cut 130 can be spaced apart from the center line 126. In the illustrated example, the cut 130 and the portions and segments thereof are substantially straight. In other example, one or more portions and/or segments of the cut 130 can be non-straight, such as wholly or partially curved, angled, piecewise linear, etc.

FIG. 1B shows a partial perspective view of a system 150 that includes a printed circuit board (PCB) 152 and a packaged electronic device 153 mounted to a top side 154 of the PCB 152. The packaged electronic device 153 includes a semiconductor die 159 formed by a separated one of the unit areas 101 of the semiconductor wafer 100 of FIGS. 1 and 1A, as well as conductive leads 157 soldered to corresponding conductive pads (not shown) along the top side 154 of the PCB 152. The electronic device 153 in this example includes a molded plastic or ceramic package structure 158 that encloses at least a portion of the semiconductor die 159 and portions of the conductive leads 157. The semiconductor die 159 in this example includes an instance of the resistor electronic component 110 on a side (e.g., side 104) of the semiconductor die 159. The component 110 of the semiconductor die 159 has the above described feature 120 with a cut 130, and the first and second terminals 112 and 114 thereof are connected to a circuit of the semiconductor die 159 and/or to a circuit of the packaged electronic device 153. In one example, the top side 154 of the PCB 152 also includes an instance of the resistor electronic component 110 having the above described feature 120 with a cut 130, and the first and second terminals 112 and 114 connected to respective conductive traces 155 and 156 of the PCB 152. The described component trim cut 130 and associated trimming techniques and apparatus of the present disclosure find utility in trimmed or trimmable electronic components of one, some or all of a semiconductor wafer (e.g., wafer 100 of FIGS. 1 and 1A), an electronic device (e.g., the IC electronic device 153 of FIG. 1B) and/or a printed circuit board (e.g., the PCB 152 of FIG. 1B).

Figure 3:
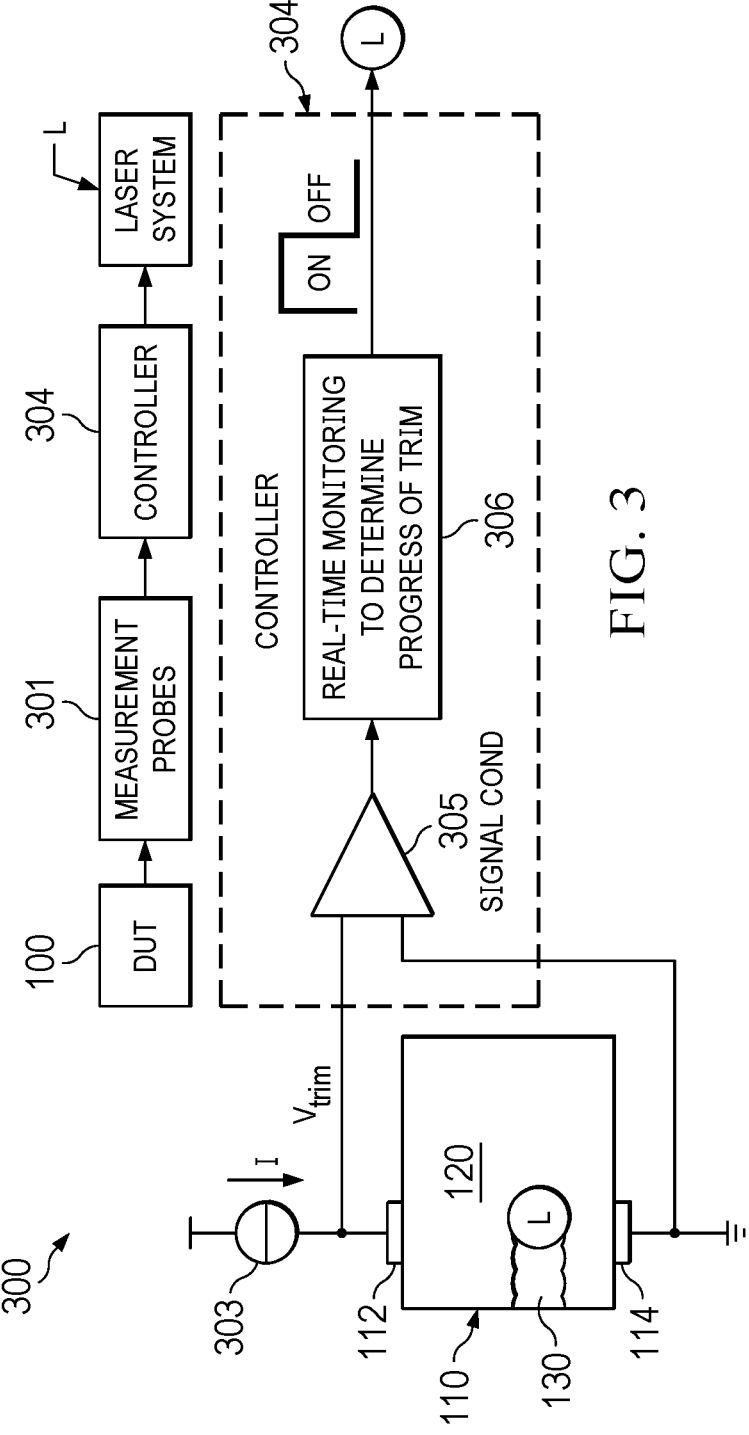
FIG. 3 is a simplified view of an electronic device manufacturing system.
Figure 3A:
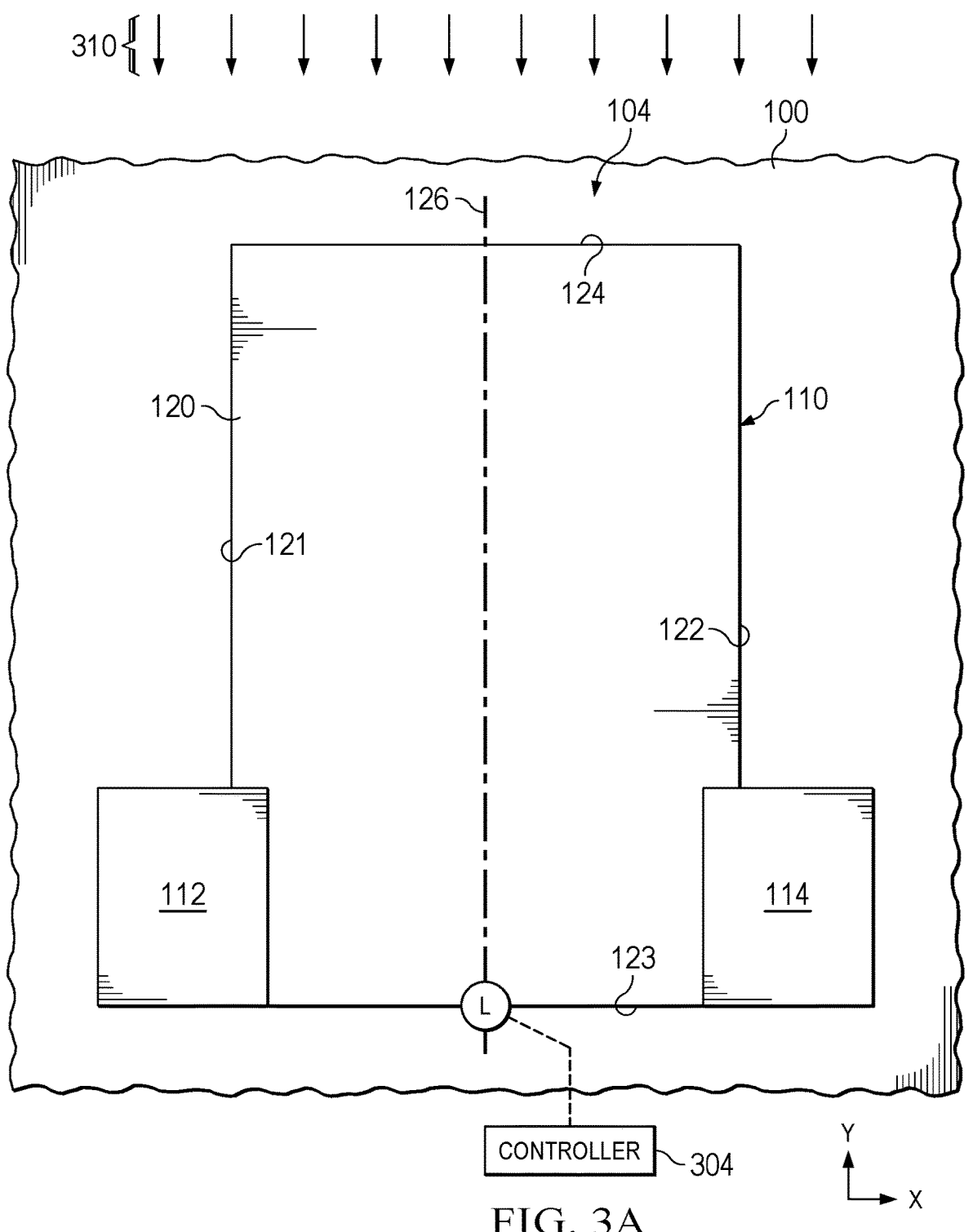
FIGS. 3A-3F are partial top views of a trimmable electronic component being laser trimmed.
Figure 3B:
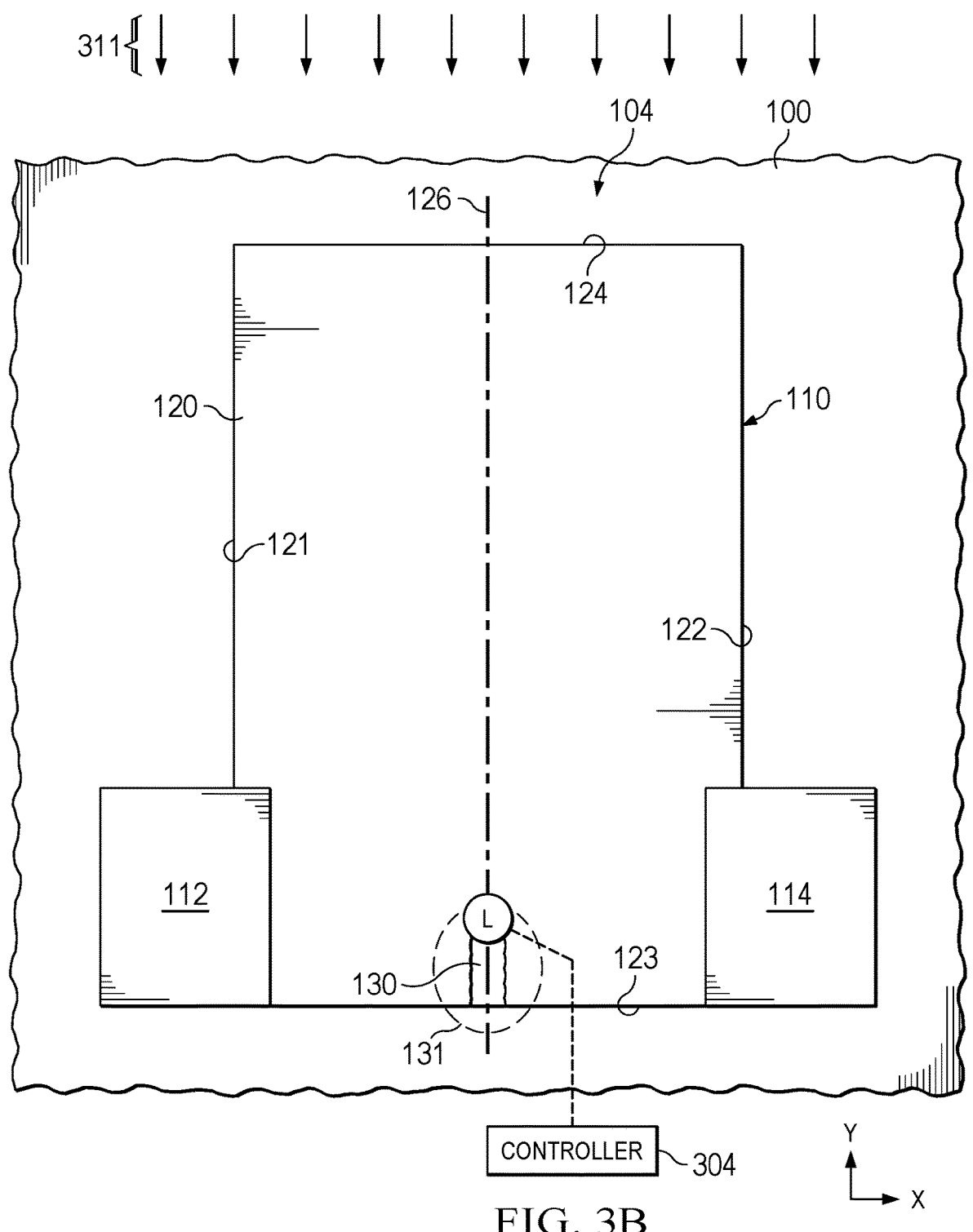
Figure 3C:
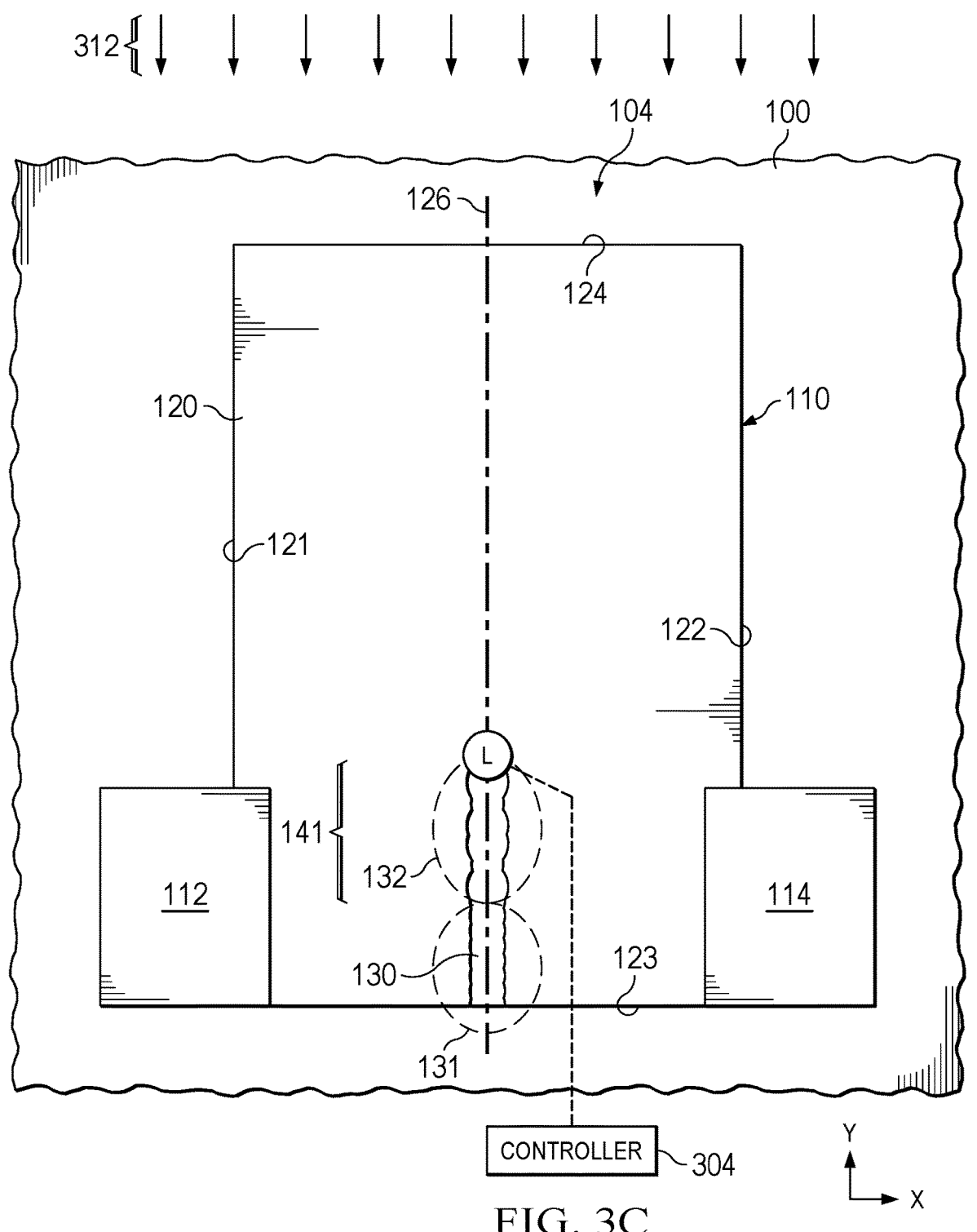
Figure 3D:
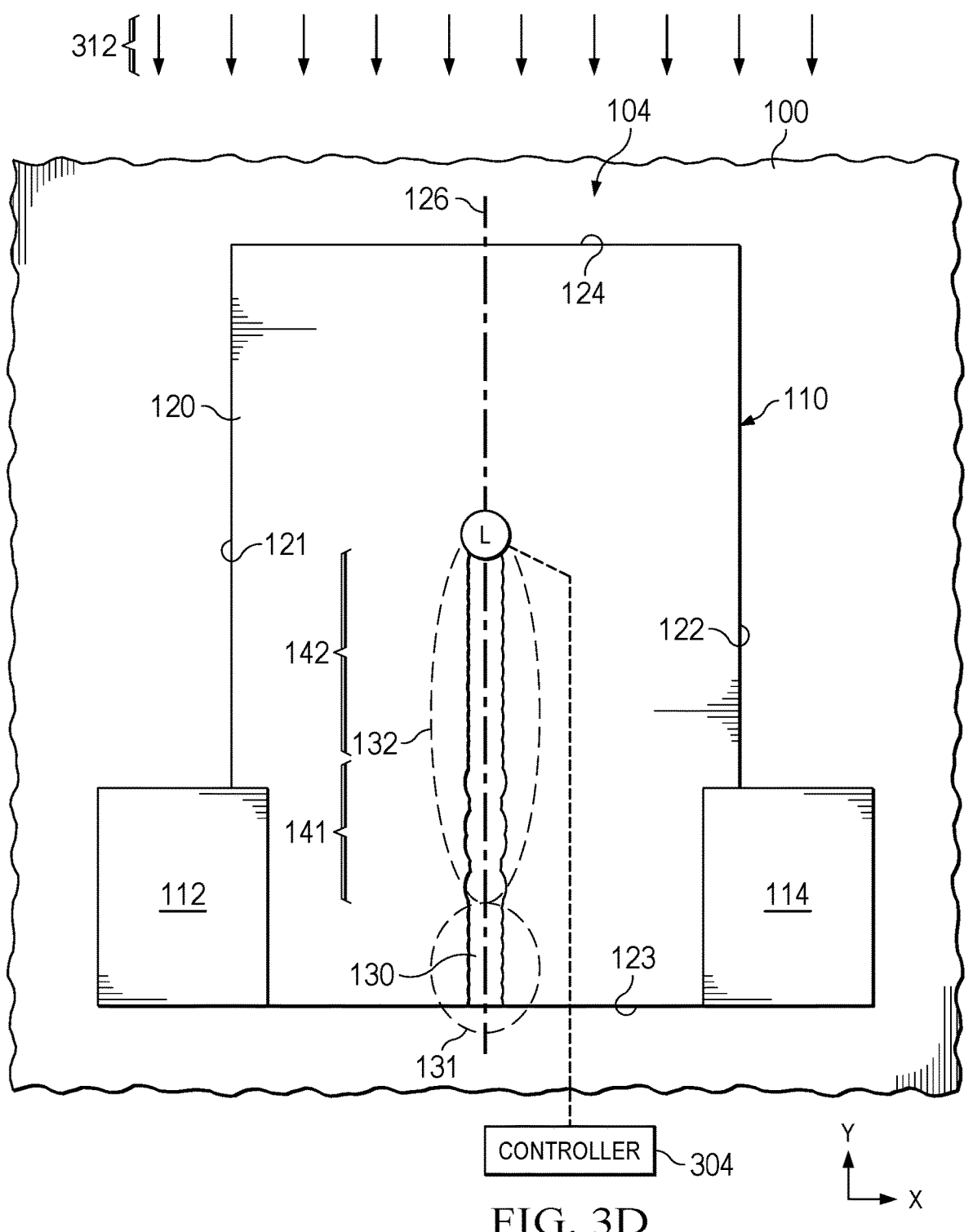
Figure 3E:
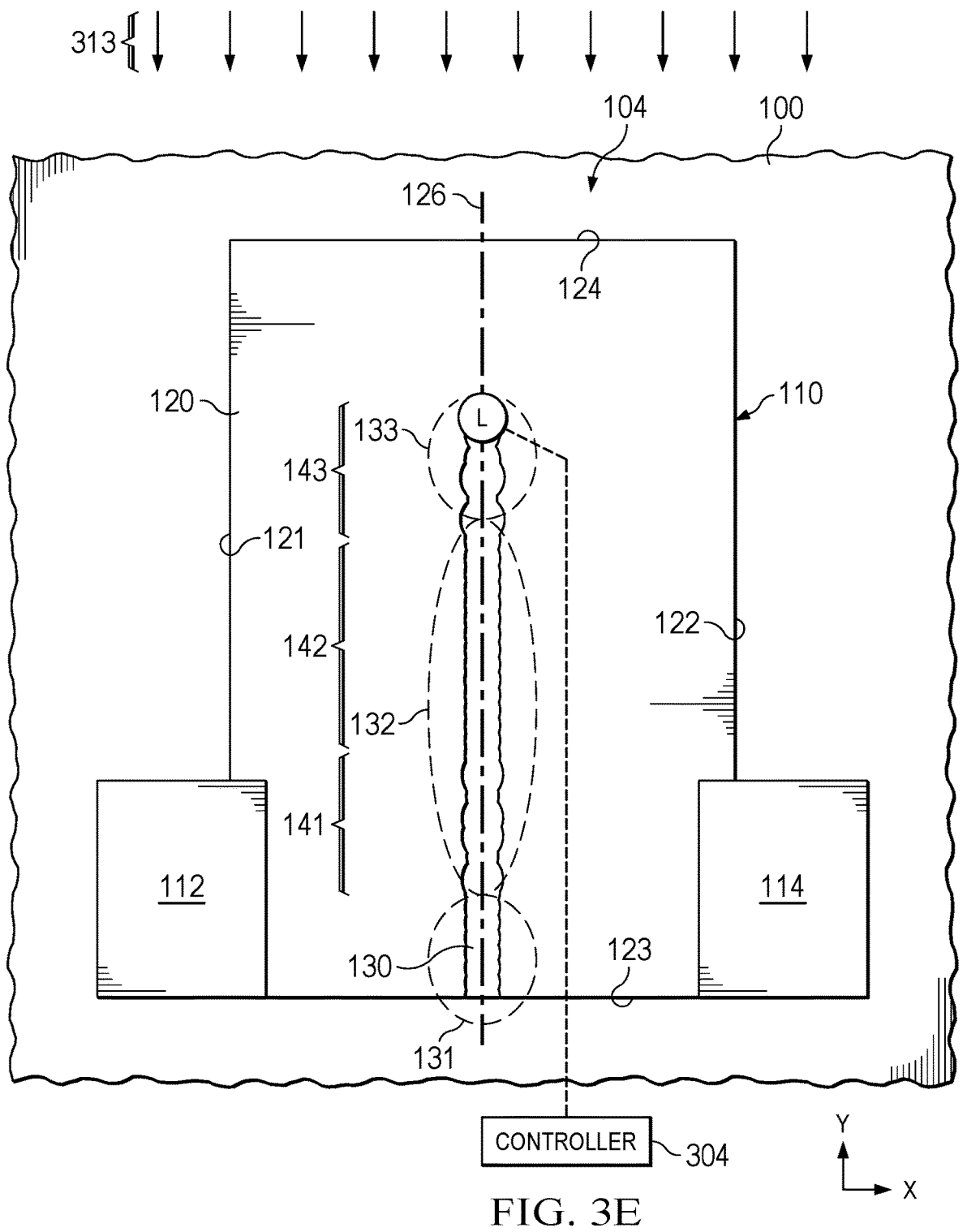
Figure 3F:
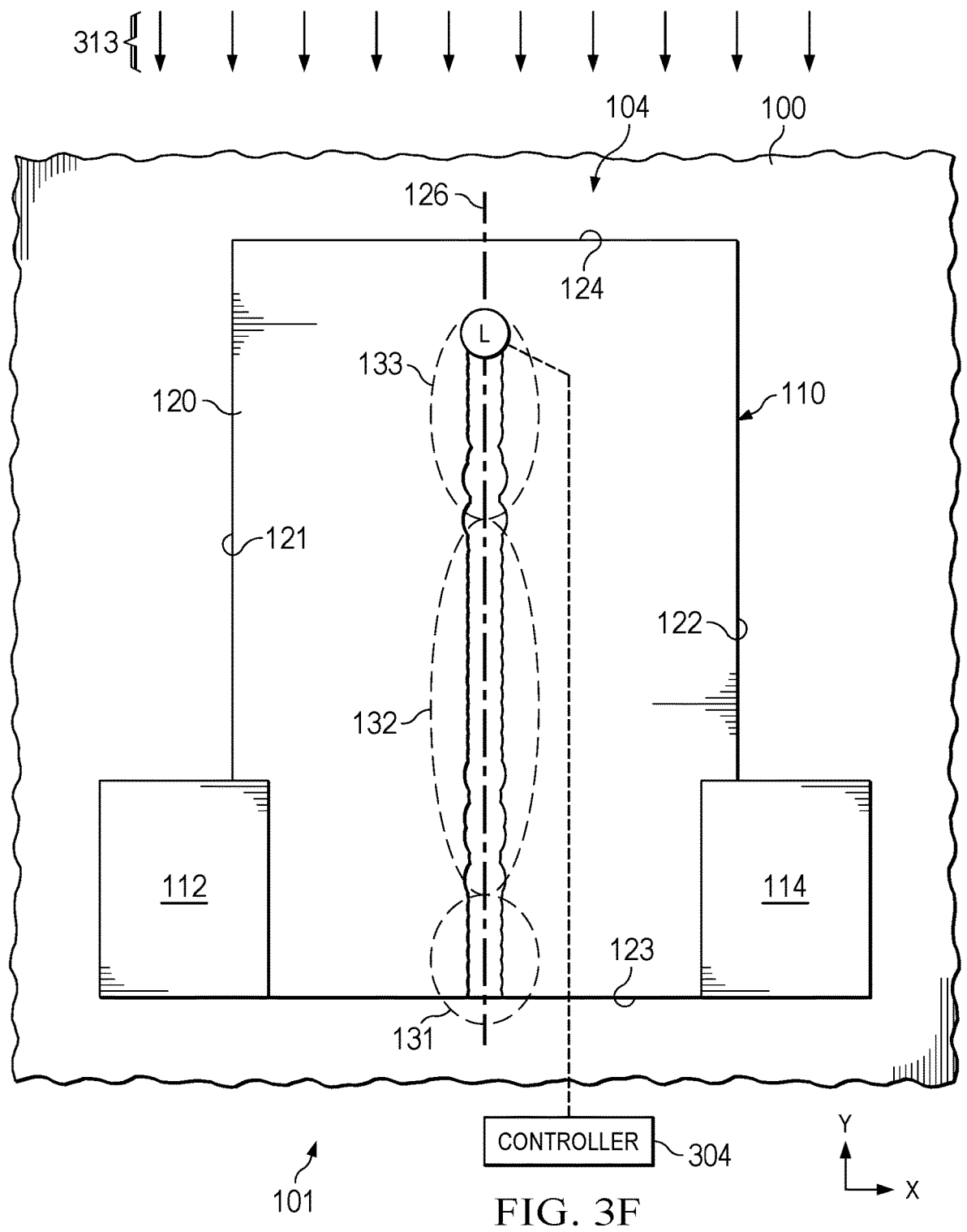

Referring also to FIGS. 2-3F, FIG. 2 shows a method 200 of fabricating an electronic component 110, with included trimming processing, FIG. 3 shows a trimming system, and FIGS. 3A-3F show trimming of the electronic component 110 of the wafer 100 in the system of FIG. 3. The method 200 of FIG. 2 is illustrated in connection with FIGS. 3-3F in trimming a SiCr resistor component 110 of the wafer 100 by forming the cut 130 as described above using a laser cutting tool. The method 200 is implemented in one example in a system 300 illustrated in FIG. 3 to form the trim cut 130 in a unit area 101 of the semiconductor wafer 100 prior to die separation and packaging. In other implementations, a laser cutting tool can be used to implement the method 200 to form a trim cut in a component feature on or in a separated or singulated semiconductor die (e.g., die 159 of FIG. 1B after wafer singulation and prior to device packaging) and/or to trim form a trim cut in a component feature on or in a PCB (e.g., PCB 150 of FIG. 1B). In the illustrated example, a SiCr thin film resistor component 110 of the unit area 101 of wafer 100 has its resistance changed by forming the cut 130 while the resistance of the component 110 is measured by a sensing circuit in operation.

The system 300 in FIG. 3 includes measurement probes 301, such as probe needles that contact copper pads, bumps, or other conductive features of the wafer 100 or other device under test (DUT), such as the semiconductor die 159 or PCB 150 of FIG. 1B. The measurement probes 301 in one example probe the terminals 112 and 114 of the electronic component 110 being trimmed and the measurement probes 301 are operatively coupled with a controller 304 to interface with a laser cutting tool L to create the trim cut 130. As further shown in FIG. 3, the system 300 has a current source circuit 303 configured to provide a current signal I to the first terminal 112 of the probed component 110. The second terminal 114 is coupled to a circuit ground reference by the measurement probes 301 as schematically shown in FIG. 3. The cut 130 forces the current I to take a longer path through the thin film of the feature 120 and increases the resistance of the component 110.

The controller 304 is configured to control the laser cutting tool L to remove material from the feature 120 and create the cut 130. The controller 304 is configured to control the position of the laser cutting tool L along the first and second directions X and Y in the illustrated orientation and to implement laser stop control to control the end of the cut 130 based on a measured component trim voltage signal $V_{trim}$ across the terminals 112 and 114 of the component 110 during trimming. The controller 304 provides a real-time feedback loop used to turn off the laser cutting tool L in response to the measured component trim voltage signal $V_{trim}$ exceeding a threshold while the current source 303 provides the current I to the component 110. The controller 304 in one example includes a signal conditioning circuit 305 that senses the component trim voltage signal $V_{trim}$, and a real-time monitoring circuit 306 determines the progress of the trim cut 130 based on the output of the signal conditioning circuit 305 and controls the status (on or off) of the laser cutting tool L.

The laser cutting tool L in one example operates on a pulse by pulse basis with one voltage sample taken per Qrate period of the laser L. The operating Q-Rate is controlled by the controller 304 or set to a fixed rate in various implementations to set how fast the laser L fires, such as 100 Hz to 10 kHz, for example, approximately 1-2 kHz. A slower Q-rate setting allows more time for the trimmed component 110 of the DUT 100 to change behavior and for an active trim control loop to stabilize. In one example, the controller 304 sets or adjusts the laser Qrate to go as fast as is stable to facilitate reduced trimming time and manufacturing cost. The controller 304 determines whether to make the next pulse based on a most recent sample of the component trim voltage signal $V_{trim}$ and the output of the real-time monitoring circuit 306. The controller 304 in one example selectively adjusts the speed and separation of laser pulses to enhance precision in achieving a desired final component resistance. In these or other examples, the controller 304 controls laser pulse energy. In these or other examples, the controller 304 controls the bite size as the center to center spacing of subsequent pulses, for example, in a range of approximately 0.1 μm to 2.6 μm, such as approximately 0.2 μm to 2.0 μm, where smaller change per pulse facilitates finer resolution on the trim cut 130 and thus on the final component resistances for the resistor example 110 but involves a tradeoff in terms of increased trimming time and manufacturing cost. In one implementation, the controller 304 uses a bite size tailored to a desired resolution for a specific trim leg or portion. In these or other examples, the controller 304 controls speed and position of the cutting tool L along the first and second directions X and Y.

The method 200 includes positioning the laser cutting tool L at a starting location (e.g., the prospective first end of the cut 130 to be formed) at 202 in FIG. 2. FIG. 3A shows one example, in which an initial tool placement or location process 310 is performed that positions the laser cutting tool L at the starting location along the third side 123 of the component feature 120. In the illustrated example, the starting location is at least partially along the center line 126 of the component feature 120.

At 204 in FIG. 2, the controller 304 controls the laser cutting tool L at a first pulse rate Qrate1 to form the first cut portion 131. FIG. 3B shows one example of a first portion cutting process 311, in which the controller 304 controls the laser cutting tool L to translate the laser cutting tool L approximately along the second direction Y from the starting location toward the fourth side 124 of the component feature 124 to form the first cut portion 131 extending from the third side 123 toward the fourth side 124 approximately along the second direction Y. In one example, the controller 304 translates the laser cutting tool L at a relatively high first speed to form the first cut portion 131 at 204. In these or another example, the first pulse rate $Q_{rate1}$ is approximately 100 Hz to approximately 4 kHz, such as approximately 1 kHz to approximately 2 kHz.

At 206 in FIG. 2, the controller 304 controls the laser cutting tool L to form the second cut portion 132. FIGS. 3C-3E show one example of a second portion cutting process 312, in which the controller 304 controls the laser cutting tool L to translate the laser cutting tool L at least partially toward the fourth side 124 to form the second cut portion 132 extending from the first cut portion 131 toward the fourth side 124. In the illustrated example, the second cut portion 132 includes multiple segments 141 and 142 (FIG. 1A above) and the controller 304 controls the laser cutting tool L as shown in FIG. 3C to translate the laser cutting tool L to form the first segment 141. During formation of the first segment 141, the controller 304 changes the laser pulse rate from the first pulse rate $Q_{rate1}$ to a higher second pulse rate $Q_{rate2}$ ($Q_{rate2}>Q_{rate1}$). The pulse rate increase in one example is sufficient to cause transitory instability in the laser control loop and the instability creates deviations in at least one of one of the cut spot sizes SS and/or the cut spot spacing distances SD, as described above in connection with FIG. 1A.

In FIG. 3D, the controller 304 controls the laser cutting tool L to continue translating the laser cutting tool L at the approximately along the second direction Y to form the second segment 142 of the second cut portion 132. The second segment 142 in this example extends at least partially along the center line 126, although not a requirement of all possible implementations (e.g., see FIGS. 4 and 5 below). The second segment 142 in this example does not include significant cut spot size or cut spot spacing deviations, although not a requirement of all possible implementations. In this example, the laser cutting tool control loop has stabilized for operation at the second pulse rate $Q_{rate2}$ and any deviations in the cut spot size or cut spot spacing are less than 10%. In one example, the second pulse rate $Q_{rate2}$ is greater than or equal to twice the first pulse rate $Q_{rate1}$. In this or another example, the second pulse rate $Q_{rate2}$ is approximately 8 kHz to approximately 20 kHz, such as approximately 10 kHz.

At 208 in FIG. 2, the controller 304 controls the cutting tool L to form the third cut portion 133. FIG. 3E shows one example of a third portion cutting process 313, in which the controller 304 controls the laser cutting tool L to translate the laser cutting tool L at least partially along the second direction Y and at least partially along the center line 126 toward the fourth side 124 to form the final cut portion 133. In one example, the controller 304 translates the laser cutting tool L at a slower translation speed to form the final cut portion 133 at 208 than the second translation speed used at 206 to form the second cut portion 132, although not a requirement of all possible implementations. Using a slower speed facilitates accurate cut termination without overshooting the desired final component resistance value. During this phase in one example, the controller 304 changes the laser pulse rate from the second pulse rate $Q_{rate2}$ to a lower third pulse rate $Q_{rate3}$ ($Q_{rate2}>Q_{rate3}$). In one example, the second pulse rate $Q_{rate2}$ is greater than or equal to twice the third pulse rate $Q_{rate3}$. In these or another example, the third pulse rate $Q_{rate3}$ is approximately 1 kHz to approximately 2 kHz. The pulse rate decrease in one example is sufficient to again cause transitory instability in the laser control loop and the instability creates the deviations in at least one of one of the cut spot sizes SS and/or the cut spot spacing distances SD in the third segment 143, as described above in connection with FIG. 1A. The third portion cutting process 313 continues in FIG. 3F with the controller 304 controlling the laser cutting tool L at the third pulse rate $Q_{rate3}$ while translating the laser cutting tool L approximately along the second direction Y. The laser cutting terminates in one example by operation of the controller 304 in FIG. 3 above based on the resistance of the component feature 120 reaching a desired value.

Figure 4:
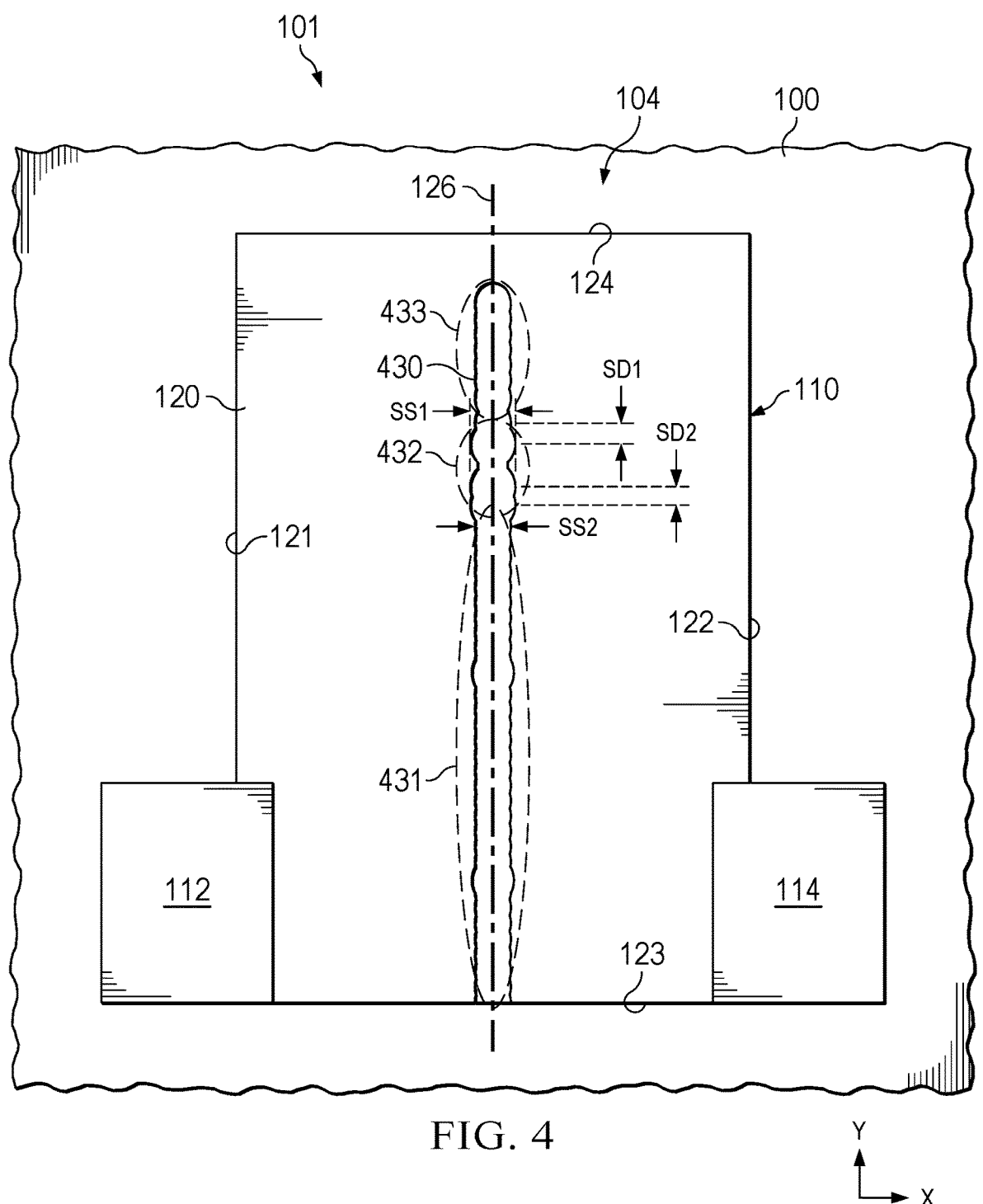
FIG. 4 is a partial side view of a trimmable electronic component with another example trim cut in a unit of the semiconductor wafer.

FIG. 4 shows another implementation of the example trimmable electronic component 110 with another example trim cut 430 in a unit of the semiconductor wafer. In this example, the processing at 204 in the process 200 of FIG. 2 is omitted and the initial first portion 431 of the trim cut 130 is formed using the higher second pulse rate $Q_{rate2}$ (e.g., approximately 8 kHz to approximately 20 kHz, such as approximately 10 kHz), and the controller 304 forms a second cut portion 432 and 433 at a lower pulse rate (e.g., $Q_{rate3}$) that is lower than $Q_{rate2}$ (e.g., less than half $Q_{rate2}$, such as approximately 1 kHz to approximately 2 kHz). In this example, the controller 304 reduces the pulse rate from $Q_{rate2}$ to $Q_{rate3}$) during formation of the portion 432, leading to the deviations in to form the second portion 432 with deviations in one or both of the cut spot size (e.g., SS1 and SS2 in FIG. 4) and the center-to-center cut spot spacing distances (e.g., SD1 and SD2). In this example, the remaining part 433 of the second portion is formed at the pulse rate $Q_{rate3}$ after the laser control loop has stabilized, for example, at the same or a lower translation speed than was used in forming the first cut portion 431. This example can provide further benefits with respect to reducing trim time and manufacturing cost.

Figure 5:
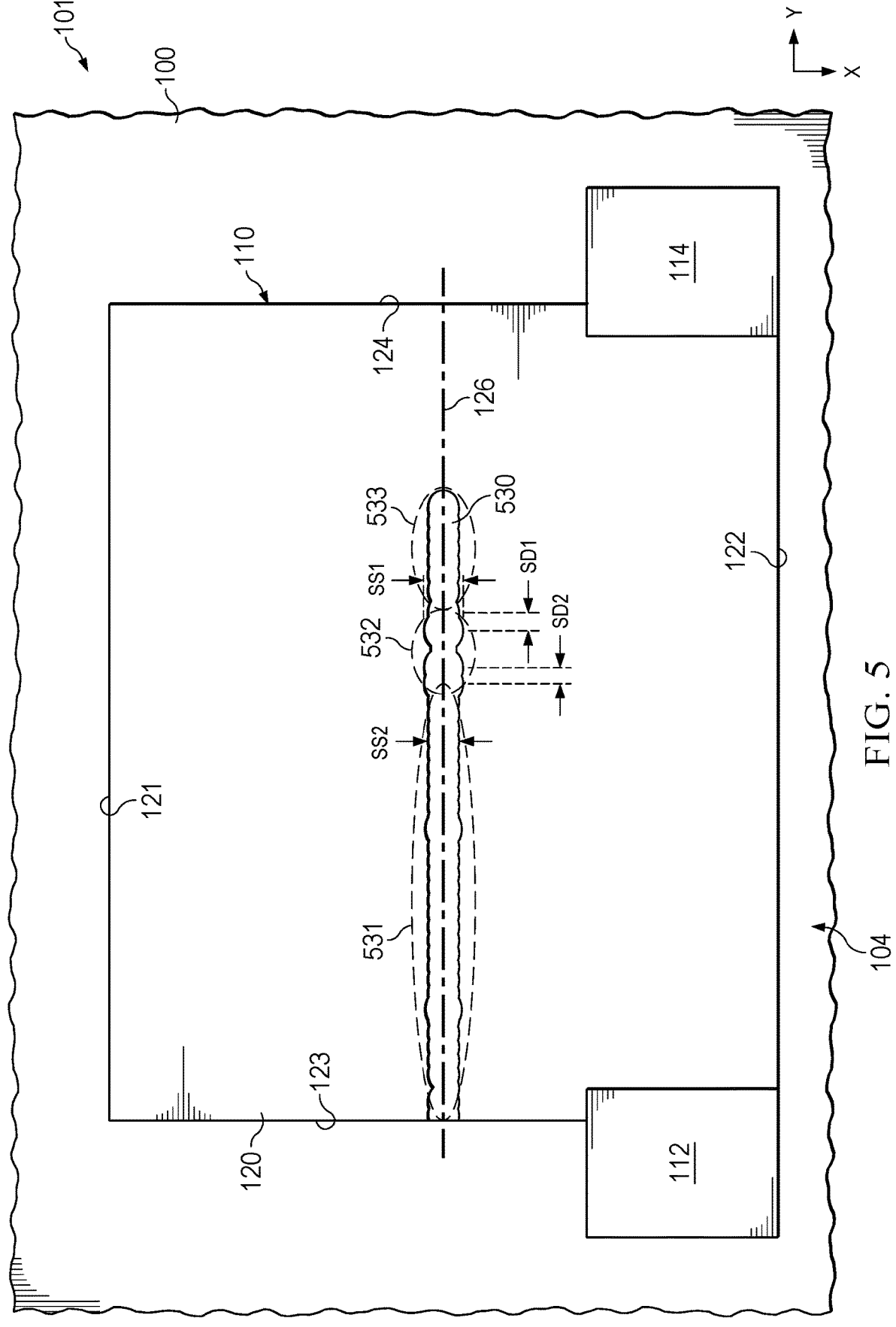
FIG. 5 is a partial side view of a trimmable electronic component with another example trim cut in a unit of the semiconductor wafer.

FIG. 5 shows another implementation with two cut portions 531 and 532, 533 formed as described above in connection with FIG. 4, where the cut 530 is formed approximately parallel to the direction of current flow between the terminals 112 and 114. The cut 530 in this example is spaced apart from the center line 126, although not a requirement of all possible implementations. In this example, the processing at 204 in the process 200 of FIG. 2 is omitted and the initial first portion 531 of the trim cut 130 is formed using the higher second pulse rate $Q_{rate2}$ (e.g., approximately 8 kHz to approximately 20 kHz, such as approximately 10 kHz), and the controller 304 forms a second cut portion 532 and 533 at a lower pulse rate (e.g., $Q_{rate3}$) that is lower than $Q_{rate2}$ (e.g., less than half $Q_{rate2}$, such as approximately 1 kHz to approximately 2 kHz). In this example, the controller 304 reduces the pulse rate from $Q_{rate2}$ to $Q_{rate3}$) during formation of the portion 532, leading to the deviations in to form the second portion 532 with deviations in one or both of the cut spot size (e.g., SS1 and SS2 in FIG. 5) and the center-to-center cut spot spacing distances (e.g., SD1 and SD2). In this example, the remaining part 533 of the second portion is formed at the pulse rate $Q_{rate3}$ after the laser control loop has stabilized, for example, at the same or a lower translation speed than was used in forming the first cut portion 531. This example can provide further benefits with respect to reducing trim time and manufacturing cost. In further examples (not shown), a three portion cut can be formed (e.g., as described above in connection with FIGS. 1A and 3A-3F) using a first pulse rate $Q_{rate1}$ for the first cut portion, a higher second pulse rate $Q_{rate2}$ for the second cut portion, and a lower third pulse rate $Q_{rate3}$ for the final portion, where the trim cut extends approximately parallel to the direction of current flow between the terminals 112 and 114.

Described examples facilitate enhanced trim cut accuracy with low cost and processing time by increasing the pulse rate in forming the second cut portion 132 without using multiple feature cuts. The controller 304 in some examples uses use real-time monitoring of the electrical change caused by every laser pulse and real-time monitoring of the rate of the electrical change. The described examples provide processing time and cost advantages over simply selecting a single conservative pulse rate selected to ensure accurate final component trim value at the expense of longer processing time. The controller 304 in described examples can use conservative values for the first and third pulse rates $Q_{rate1}$ and $Q_{rate3}$, for example 100 Hz to 4000 Hz. The first and final cut portions 131 and 133 can be formed at relatively low translation speeds, for example, to enhance final cut termination accuracy. The controller 304 changes to a higher second pulse rate $Q_{rate2}$ and can increase the translation speed in forming the second cut portion 132 to facilitate reduced processing time and manufacturing cost. In certain implementations, the second pulse rate $Q_{rate2}$ is high enough to create laser loop control instability resulting from the increase and subsequent decrease in the pulse rate which can create the above described deviations in the cut spot sizes SS and/or the cut spot spacing distances SD of the first and/or third segments 141 and 143, but this loop instability is far from the target end of the cut 130. In certain implementations, the pulse rate can be increased in forming the second cut portion 132 without significant translation speed change. In other implementations, for example, where the laser control circuitry correlates pulse rate and translation speed, the controller 304 increases both the pulse rate and the translation speed when switching from the first cut portion 131 to the second cut portion 132, and then decreases both the pulse rate and translation speed to form the final cut portion 133. Described examples can reduce processing time and manufacturing cost using simpler trim features that facilitate ease of development and less die area for trimmable components and provide advantages in terms of using a single bite size and semi-conservative pulse rate without the typical penalties.

Modifications are possible in the described examples, and other implementations are possible, within the scope of the claims.

What is claimed is:

1. An electronic component, comprising:
first and second terminals; and
a feature having opposite first and second sides spaced apart from one another along a first direction, third and fourth sides spaced apart from one another along an orthogonal second direction, and a cut extending in the feature and having a first cut portion, a second cut portion, and a final cut portion that extends from the second cut portion toward the fourth side, the first terminal is connected to the first and third sides, the second terminal is connected to the second and third sides, the first cut portion extending from the third side toward the fourth side along the second direction, and the second cut portion extending from the first cut portion toward the fourth side and having deviations in at least one of one of a cut spot size and a cut spot spacing distance.

2. The electronic component of claim 1, wherein the second cut portion has deviations of approximately 10% to 50% in at least one of one of the cut spot size and the cut spot spacing distance.

3. The electronic component of claim 2, wherein the second cut portion has deviations of approximately 20% to 40% in at least one of one of the cut spot size and the cut spot spacing distance.

4. The electronic component of claim 1, wherein the cut extends at least partially along a center line that is midway between the first and second sides of the feature.

5. The electronic component of claim 1, wherein the cut extends long the second direction.

6. The electronic component of claim 1, wherein the electronic component extends on or in a semiconductor wafer.

7. The electronic component of claim 1, wherein the electronic component extends on or in a semiconductor die.

8. The electronic component of claim 1, wherein the electronic component extends on or in a circuit board.

9. A system for fabricating an electronic component, the system comprising:
a laser cutting tool configured to remove material from a feature of an electronic component, the feature having opposite first and second sides spaced apart from one another along a first direction, and third and fourth sides spaced apart from one another along an orthogonal second direction; and
a controller configured to:
control the laser cutting tool at a first pulse rate and translate the laser cutting tool to form a first cut portion in the feature of the electronic component, the first cut portion extending from the third side toward the fourth side along the second direction;
control the laser cutting tool at a higher second pulse rate and translate the laser cutting tool to form a second cut portion extending from the first cut portion toward the fourth side; and control the laser cutting tool at a third pulse rate and translate the laser cutting tool to form a final cut portion extending from the second cut portion toward the fourth side, the third pulse rate less than the second pulse rate.

10. An electronic component, comprising:

first and second terminals; and a feature having opposite first and second sides spaced apart from one another along a first direction, third and fourth sides spaced apart from one another along an orthogonal second direction, and a cut extending in the feature and having a first cut portion, a second cut portion, and a final cut portion, the first terminal connected to a portion of the first side, the second terminal connected to a portion of the second side, the first cut portion extending from the third side toward the fourth side along the second direction, and the second cut portion extending from the first cut portion toward the fourth side and having deviations in at least one of one of a cut spot size and a cut spot spacing distance.

11. The electronic component of claim 10, wherein the second cut portion has deviations of approximately 10% to 50% in at least one of one of the cut spot size and the cut spot spacing distance.

12. The electronic component of claim 11, wherein the second cut portion has deviations of approximately 20% to 40% in at least one of one of the cut spot size and the cut spot spacing distance.

13. The electronic component of claim 10, wherein the cut extends at least partially along a center line that is midway between the first and second sides of the feature.

14. The electronic component of claim 10, wherein the cut extends long the second direction.

15. The electronic component of claim 10, wherein the electronic component extends on or in a semiconductor wafer.

16. The electronic component of claim 10, wherein the electronic component extends on or in a semiconductor die.

17. The electronic component of claim 10, wherein the electronic component extends on or in a circuit board.

* * * * *